(12) United States Patent
Satake

(10) Patent No.: US 7,791,505 B2
(45) Date of Patent: Sep. 7, 2010

(54) INFORMATION PROCESSING APPARATUS AND LIQUID DETECTION METHOD

(75) Inventor: Shigeru Satake, Nishitama-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 870 days.

(21) Appl. No.: 11/641,189

(22) Filed: Dec. 18, 2006

(65) Prior Publication Data

US 2008/0036628 A1 Feb. 14, 2008

(30) Foreign Application Priority Data

Dec. 23, 2005 (JP) ............... 2005-371126

(51) Int. Cl.
*H03K 17/94* (2006.01)
(52) U.S. Cl. ............... 341/22; 341/26; 200/302.1; 200/302.2; 200/302.3; 200/511; 200/512
(58) Field of Classification Search ............ 341/22, 341/26; 200/302.1–302.3, 511, 512
See application file for complete search history.

(56) References Cited

U.S. PATENT DOCUMENTS

| | | | |
|---|---|---|---|
| 3,969,595 A | * | 7/1976 | Johnson .................. 200/5 A |
| 4,515,999 A | * | 5/1985 | Harper .................... 200/5 A |
| 6,999,009 B2 | * | 2/2006 | Monney .................... 341/34 |
| 2004/0008129 A1 | * | 1/2004 | Philipp .................... 341/22 |

FOREIGN PATENT DOCUMENTS

| | | |
|---|---|---|
| JP | 2-129859 | 10/1990 |
| JP | 06-307968 | 11/1994 |
| JP | 2003-115235 | 4/2003 |
| JP | 2004235724 | 8/2004 |

OTHER PUBLICATIONS

Japanese Office Action dated Nov. 20, 2007 for application No. 20053371126.

* cited by examiner

*Primary Examiner*—Timothy Edwards, Jr.
(74) *Attorney, Agent, or Firm*—Blakely, Sokoloff, Taylor & Zafman LLP

(57) ABSTRACT

According to one embodiment, an information processing apparatus includes a key matrix unit having a plurality of switches, a plurality of operation keys which are provided in association with a part of the plurality of switches, and a first detection unit which executes a scan process for the key matrix unit, thereby detecting on/off states of the plurality of switches, the first detection unit executes a predetermined process in a case where the first detection unit detects that the switches, which are not associated with the operation keys, are in an ON state.

8 Claims, 4 Drawing Sheets

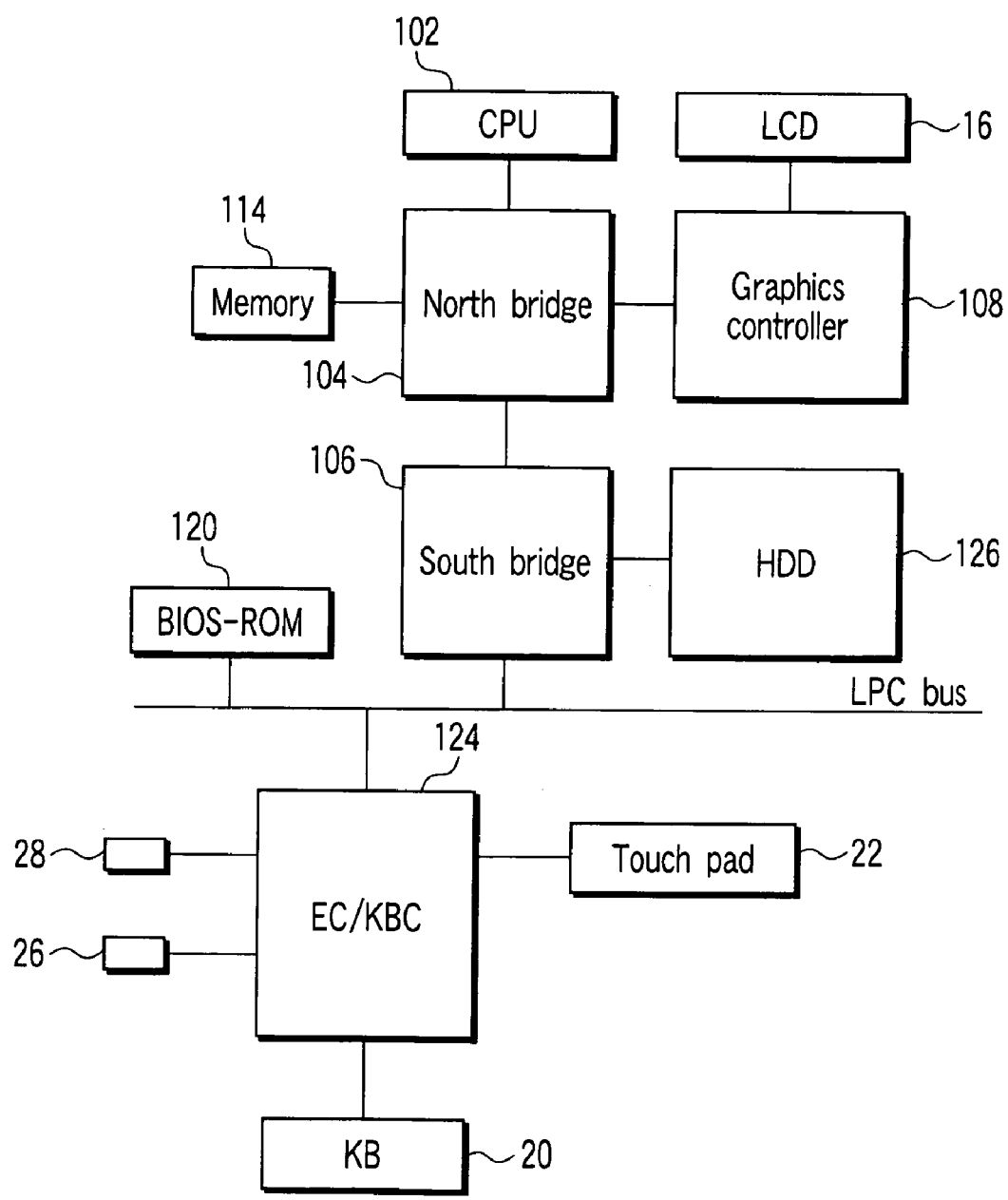
F I G. 2

INFORMATION PROCESSING APPARATUS AND LIQUID DETECTION METHOD

CROSS-REFERENCE TO RELATED APPLICATIONS

This application is based upon and claims the benefit of priority from Japanese Patent Application No. 2005-371126, filed Dec. 23, 2005, the entire contents of which are incorporated herein by reference.

BACKGROUND

1. Field

One embodiment of the invention relates to an information processing apparatus which detects wetting of a keyboard with a liquid, and a liquid detection method.

2. Description of the Related Art

In the case of a personal computer, a keyboard is frequently used in order to input characters, etc. (Jpn. Pat. Appln. KOKAI Publication No. 2003-115235). If a liquid such as water is splashed on a keyboard, the keyboard would become non-usable. In some cases, a notebook personal computer is configured such that a keyboard is provided over a main board on which a CPU is mounted. In this configuration, if water, which is splashed on the keyboard, infiltrates into the main board, the computer would become inoperable in worst cases.

Under the circumstances, there is a demand for a technique for detecting whether the keyboard is wetted with a liquid such as water. Jpn. UM. Appln. KOKAI Publication No. 2-129859 and Jpn. Pat. Appln. KOKAI Publication No. 6-307968 disclose techniques for detecting a liquid such as water.

These techniques require provision of dedicated patterns, circuits, etc., leading to an increase in cost. It is thus desired to detect a liquid with a simple structure.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 2 is an exemplary block diagram showing an example of the circuit configuration of the personal computer according to the embodiment of the invention;

FIG. 5 schematically shows a circuit in a case where the liquid detection switch is turned on;

DETAILED DESCRIPTION

Various embodiments according to the invention will be described hereinafter with reference to the accompanying drawings. In general, according to one embodiment of the invention, an information processing apparatus comprises a key matrix unit including a plurality of switches, a plurality of operation keys which are provided in association with a part of the plurality of switches, and a first detection unit which executes a scan process for the key matrix unit, thereby detecting on/off states of the plurality of switches, the first detection unit executes a predetermined process in a case where the first detection unit detects that the switches, which are not associated with the operation keys, are in an ON state.

Figure 1:
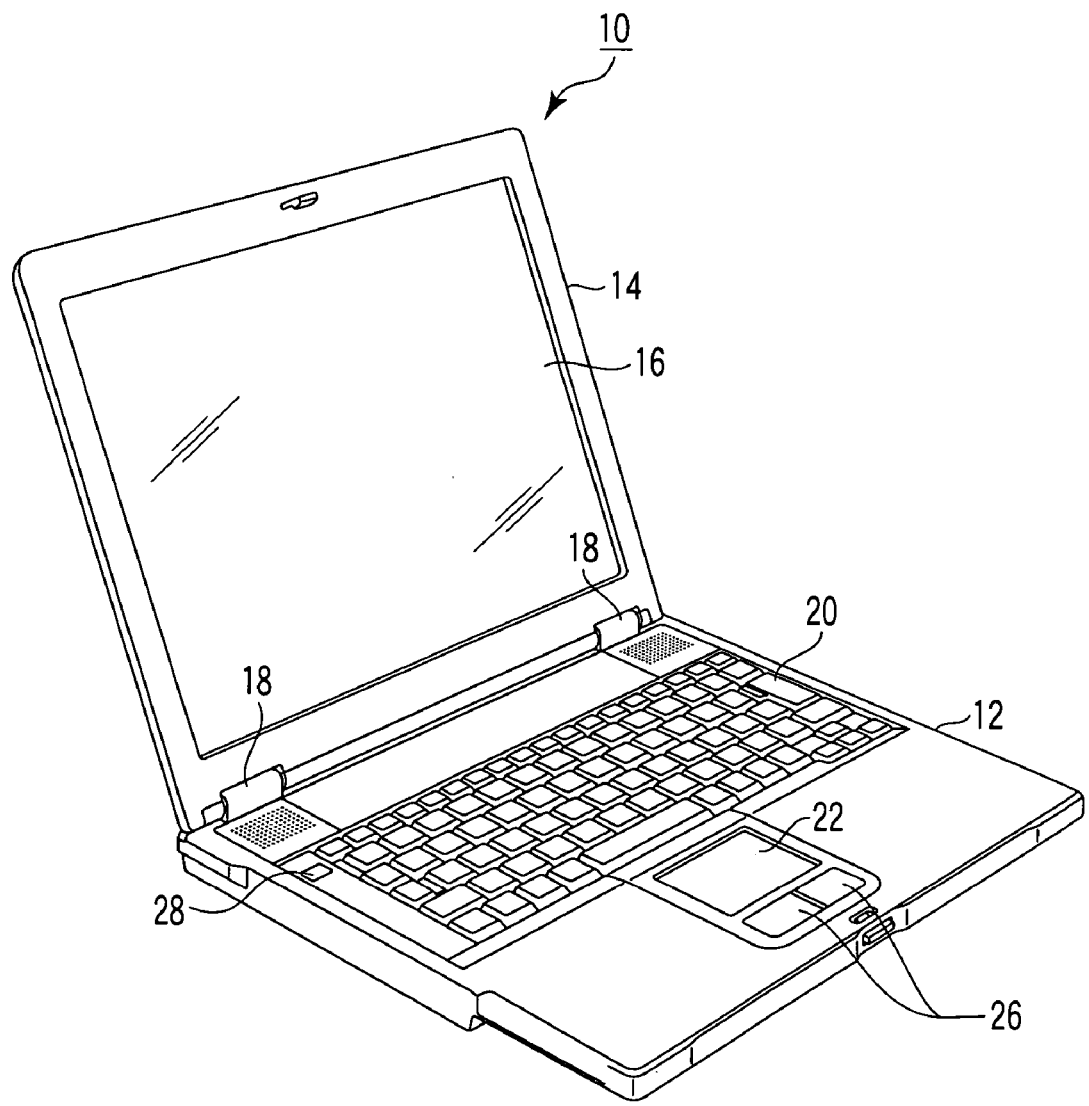
FIG. 1 is an exemplary perspective view showing an example of the schematic structure of a personal computer according to an embodiment of the present invention.

FIG. 1 shows an example of the structure of a notebook personal computer which is usable as an information processing apparatus according to an embodiment of the present invention.

A personal computer 10 comprises a computer main body 12 and a display unit 14. An LCD (Liquid Crystal Display) 16, which is a display section, is built in the display unit 14.

The display unit 14 is attached to hinges (support unit) 18, which are provided at a rear end part of the computer main body 12, so that the display unit 14 is rotatable between an open position where the top surface of the computer main body 12 is exposed and a closed position where the top surface of the computer main body 12 is covered.

The computer main body 12 has a thin boxed-shaped casing, and a keyboard 20 is provided on a central part of the upper surface of the casing. A palm rest is formed on a front-side upper surface of the casing of the computer main body 12. A touch pad 22 and touch pad control buttons 26, which are operation means, are provided on a substantially central part of the palm rest. A power button 28 for powering on/off the computer main body 12 is disposed on a rear-side upper surface of the casing of the computer main body 12.

Next, referring to FIG. 2, an example of the system configuration of the computer is described.

As is shown in FIG. 2, the computer includes a CPU 102, a north bridge 104, a main memory 114, a graphics controller 108, a south bridge 106, a BIOS-ROM 120, a hard disk drive (HDD) 126, an embedded controller/keyboard controller IC (EC/KBC) 124, and a power supply 125.

The CPU 102 is a processor which is provided in order to control the operation of the computer. The CPU 102 executes an operating system (OS) and various application programs, which are loaded in the main memory 114 from the hard disk drive (HDD) 126.

In addition, the CPU 102 loads a system BIOS (Basic Input/Output System), which is stored in the BIOS-ROM 120, into the main memory 114 and then executes the system BIOS. The system BIOS is a program for hardware control.

The north bridge 104 is a bridge device which connects a local bus of the CPU 102 and the south bridge 106. The north bridge 104 includes a memory controller 105 which access-controls the main memory 114. The north bridge 104 also has a function of executing communication with the graphics controller 108 via, e.g. an AGP (Accelerated Graphics Port) bus.

The graphics controller 108 is a display controller which controls the LCD 16 that is used as a display monitor of the computer. The graphics controller 108 includes a video memory (VRAM) and generates a video signal, which forms a display image to be displayed on the LCD 16, on the basis of display data which is rendered in the video memory by the OS/application program. The video signal that is generated by the graphics controller 108 is output to a line.

The south bridge 106 is connected to a PCI (Peripheral Component Interconnect) bus and an LPC (Low Pin Count) bus.

The embedded controller/keyboard controller IC 124 controls the keyboard 20, touch pad 22 and touch pad control buttons 26. The embedded controller/keyboard controller IC 124 is a one-chip microcomputer which monitors and controls various devices (peripheral devices, a sensor, a power circuit, etc.) regardless of the system state of the computer 10.

The present apparatus has a function of detecting wetting of the keyboard 20 with a liquid, when the keyboard is splashed with the liquid. A structure for detecting wetting of the keyboard 20 with a liquid is described below.

Figure 3:
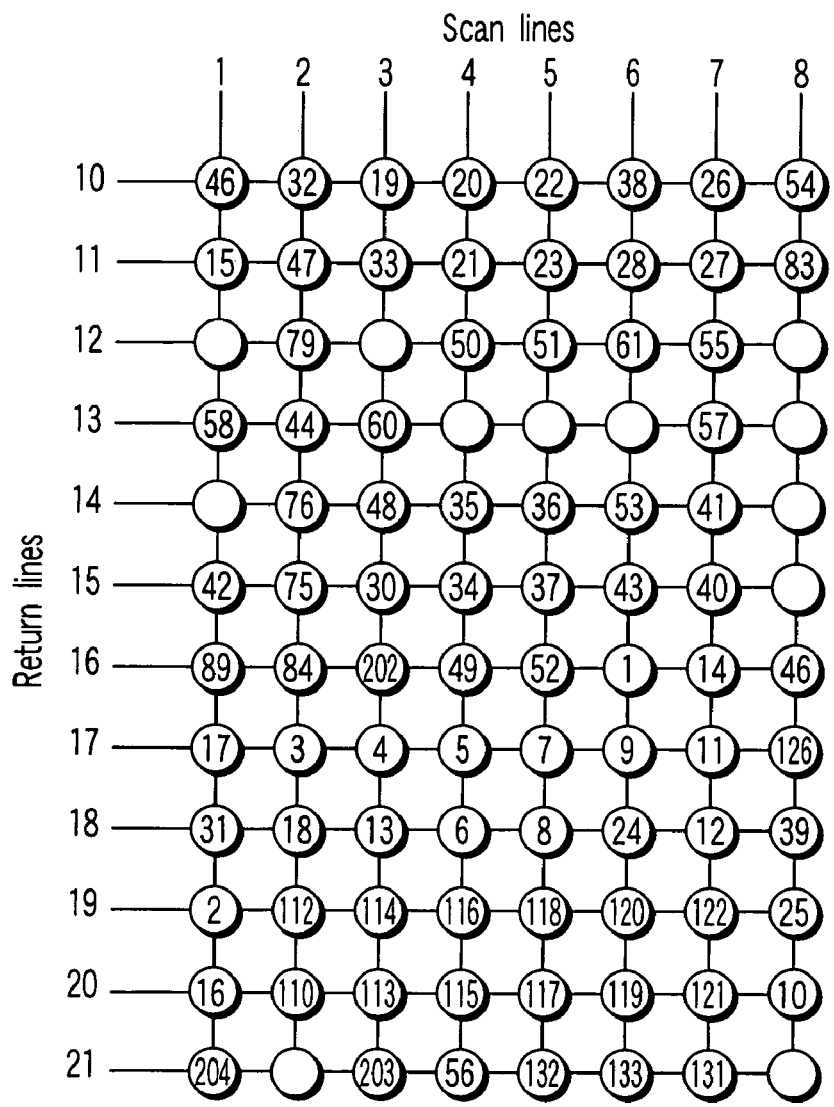
FIG. 3 shows an exemplary pattern of a key matrix which constitutes a keyboard of the personal computer according to the embodiment of the invention.

The keyboard 20 has a key matrix which is provided with a plurality of switches. FIG. 3 shows an example of the pattern of the key matrix. As shown in FIG. 3, a plurality of scan lines (one of a group of row lines and a group of column lines) and a plurality of return lines (the other of the group of row lines and the group of column lines) intersect. Switches are provided at intersections between the scan lines and return lines.

The embedded controller/keyboard controller IC 124 detects which operation key on the keyboard 20 is pressed, by a key scan operation in which scan signals are supplied to the scan lines and the on/off states of the switches are determined on the basis of voltage values of return signals which are output from the return lines.

In FIG. 3, circle marks at the intersections indicate the switches. Some of the switches have associated operation keys. When the user presses an operation key, the associated switch is turned on. In FIG. 3, switches that are indicated by circle marks with numerals are switches that have associated operation keys.

Figure 4:
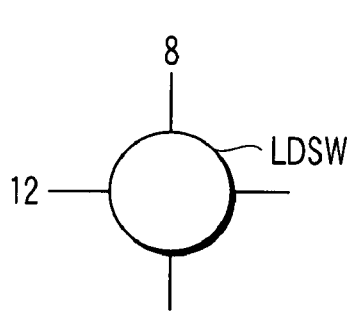
FIG. 4 shows an exemplary pattern of a liquid detection switch according to the embodiment of the invention.

In FIG. 3, there are some switches which have no associated operation keys. For example, as shown in FIG. 4, a switch LDSW, which is provided at the intersection between the eighth scan line and the 12th return line, has no associated operation key. In the description below, a switch having no associated operation key is referred to as "liquid detection switch".

Figure 5:
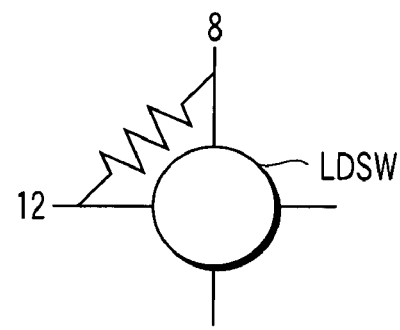

Most of liquids have electrical conductivity. If a liquid is splashed on the keyboard 20, the eighth scan line and the 12th return line are rendered electrically conductive or brought in a substantially conductive low-resistance state, as shown in FIG. 5, and the liquid detection switch LDSW is turned on.

The embedded controller/keyboard controller IC 124 can detect the on/off state of the liquid detection switch LDSW by the key scan operation. In normal cases, the liquid detection switch LDSW is not turned on since it has no associated operation key. However, if a liquid is splashed on the keyboard 20 and the liquid infiltrates into the key matrix and, as a result, the scan line and return line that constitute the liquid detection switch LDSW are electrically connected via the liquid, the scan line and return line are rendered electrically conductive or brought in a substantially conductive low-resistance state and the liquid detection switch LDSW is turned on.

The embedded controller/keyboard controller IC 124 detects wetting of the keyboard 20 with a liquid when it detects the ON state of the liquid detection switch LDSW which is normally not turned on.

Even if the scan line and return line that constitute the liquid detection switch LDSW are rendered conductive by the liquid, there may be a case in which the voltage value of the return signal from the liquid detection switch LDSW differs, due to the resistance of the liquid, from the voltage value of a return signal which is obtained when a scan line and a return line that constitute an ordinary key switch are rendered conductive. In such a case, since switches, whose on/off states are to be determined at the time of the key scan operation, are understood in advance, the threshold for determining the on/off state may be varied when the on/off state of the liquid detection switch LDSW is to be determined.

Figure 6:
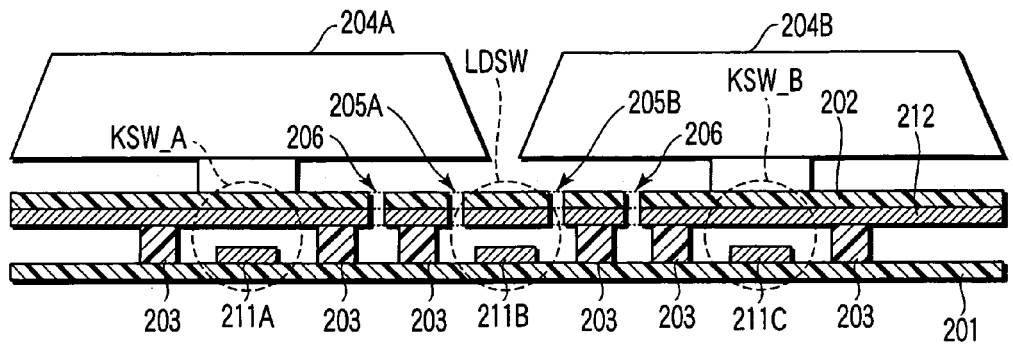
FIG. 6 is an exemplary cross-sectional view showing the structure of the keyboard according to the embodiment of the invention.

FIG. 6 is a cross-sectional view showing the liquid detection switch LDSW and the operation key section. As shown in FIG. 6, row lines (one of a group of scan lines and a group of return lines) 211A, 211B, 211C are disposed spaced apart on a lower sheet 201. An upper sheet 202 is provided to be opposed to the lower sheet 201. Column lines (the other of the group of scan lines and the group of return lines) 212 are provided on that surface of the upper sheet 202, which is opposed to the lower sheet 201.

Spacers 203 are provided between the lower sheet 201 and upper sheet 202. By the spacers 203, the lower sheet 201 and upper sheet 202 are spaced apart and the row lines 211A, 211B, 211C are prevented from contacting the column lines 212.

Key switches KSW_A and KSW_B and a liquid detection switch LDSW are provided at intersections between the row lines 211A, 211B, 211C and the column line 212. Operation keys 204A and 204B, which are associated with the key switches KSW_A and KSW_B, are provided above the KSW_A and KSW_B. For example, if the user presses the operation key 204A, the upper sheet 202 deforms and the column line 212 comes in contact with the row line 211A; and the key switch KSW_A is turned on. No operation key is provided above the liquid detection switch LDSW.

Apertures 205A and 205B are formed in the upper sheet 202 around the liquid detection switch LDSW. In usual cases, the key switch KSW_A, KSW_B is surrounded by the lower sheet 201, spacers 203 and upper sheet 202, thus preventing a liquid from infiltrating into the space containing the key switch KSW_A, KSW_B.

The present embodiment, however, aims at detecting splashing of liquid by means of the liquid detection switch LDSW. Thus, in order to easily turn on the liquid detection switch LDSW when the keyboard 20 is wetted with liquid, the apertures 205A and 205B are provided in the upper sheet 202 around the liquid detection switch LDSW. The positions of the apertures are not limited to the peripheral region of the liquid detection switch LDSW, and apertures, which penetrate the column line 212 and upper sheet 202 in the region of the liquid detection switch LDSW, may be provided.

Even if no apertures are formed around the liquid detection switch LDSW, the liquid detection switch LDSW can be turned on. For example, there is a location, such as an aperture 206, on the upper sheet 202. A liquid, which infiltrates through the aperture 206, may reach the liquid detection switch LDSW via a defective adhesion part between the upper sheet 202 and spacer 203 or a defective adhesion part between the lower sheet 201 and spacer 203, and the liquid detection switch LDSW may be turned on.

At least one liquid detection switch LDSW is provided. It is more effective to dispose the liquid detection switches LDSW in a properly distributed fashion within the area of the keyboard 20, thereby to easily detect infiltration of water.

Figure 7:
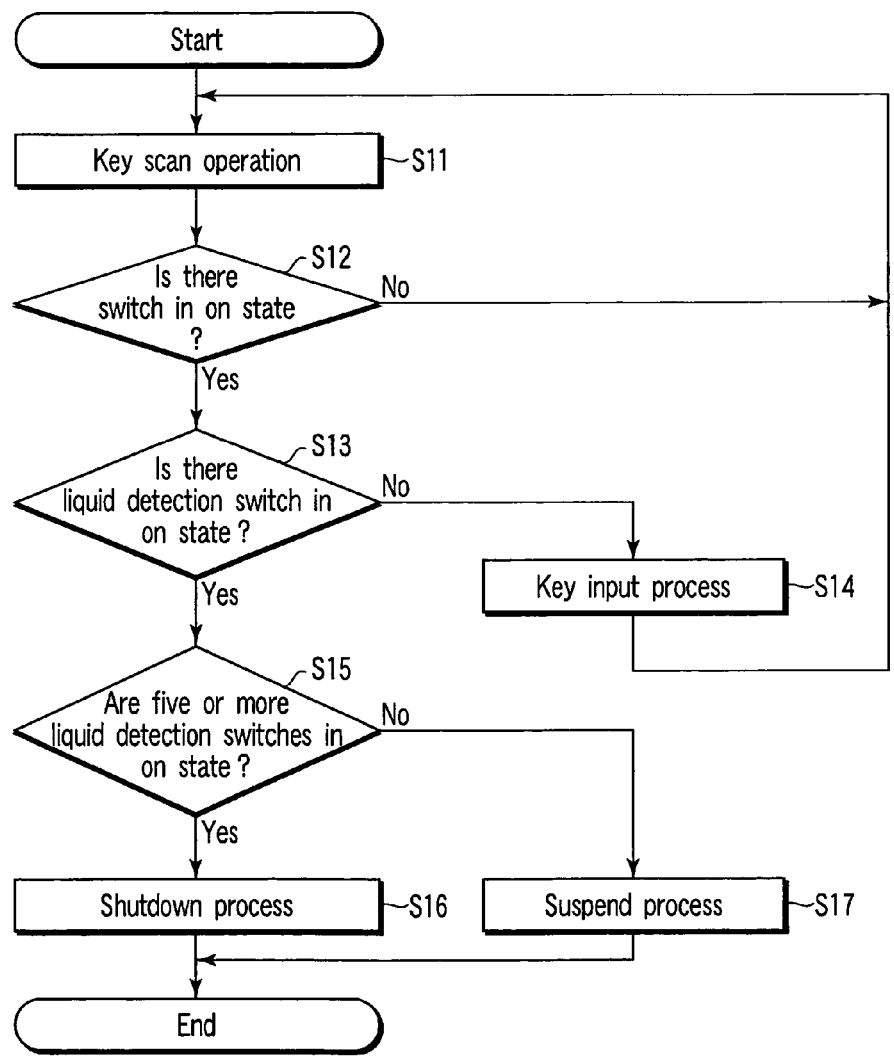
FIG. 7 is an exemplary flow chart illustrating a procedure of a liquid detection process according to the embodiment of the invention, and a procedure which follows the liquid detection.

Next, referring to FIG. 7, a description is given of a procedure of detecting wetting of the keyboard 20 with a liquid, and a procedure of a process which follows the liquid detection.

The embedded controller/keyboard controller IC 124 executes a key scan process and detects the on/off states of the switches (step S11). The embedded controller/keyboard controller IC 124 determines whether there is a switch that is in the ON state (step S12). If there is no switch that is in the ON state (No in step S12), the embedded controller/keyboard controller IC 124 executes the key scan operation of step S11 once again after passage of a predetermined time.

If there is a switch that is in the ON state (Yes in step S12), the embedded controller/keyboard controller IC 124 determines whether there is a liquid detection switch LDSW that is in the ON state (step S13). If there is no liquid detection switch LDSW that is in the ON state (No in step S13), the embedded controller/keyboard controller IC 124 executes an input process corresponding to the key switch that is operated (step S14).

If there is the liquid detection switch LDSW that is in the ON state (Yes in step S13), the embedded controller/keyboard controller IC 124 determines whether there are five or more liquid detection switches LDSW that are in the ON state (step S15). If there are five or more liquid detection switches LDSW that are in the ON state (Yes in step S15), the embedded controller/keyboard controller IC 124 instructs, via the system BIOS, the operating system to execute a shutdown process (step S16).

If there are no five or more liquid detection switches LDSW that are in the ON state (No in step S15), the embedded controller/keyboard controller IC 124 instructs, via the system BIOS, the operating system to execute a suspend process (step S17).

The reason why the shutdown process is executed when there are five or more liquid detection switches LDSW that are in the ON state is that a large quantity of liquid, which is splashed on the keyboard 20, can be estimated from the multitude of liquid detection switches LDSW that are in the ON state. If a large quantity of liquid is splashed on the keyboard 20, it is preferable to power off the system by executing the shutdown process, thereby to reduce the damage to the computer 10.

The reason why the suspend process is executed when there are no five or more liquid detection switches LDSW that are in the ON state is that a small quantity of liquid, which is splashed on the keyboard 20, can be estimated from the smallness in number of liquid detection switches LDSW that are in the ON state. If a small quantity of liquid is splashed on the keyboard 20, it is assumed that there is no problem even in the suspend state. Thus, when there are no five or more liquid detection switches LDSW that are in the ON state, the computer 10 is set in the suspend state.

As has been described above, since the wetting of the keyboard 20 with a liquid can be detected early, the suspend process or shutdown process can be executed before the liquid on the keyboard 20 infiltrates into the main board and causes fatal damage. Therefore, the damage can be minimized, and nonproliferation of accidents due to erroneous use can be realized.

In a case where a non-occupied matrix position is not present in the key matrix, if one return line (or scan line) is added, non-occupied matrix positions corresponding to the number of scan lines at maximum can be provided, and the non-occupied matrix positions can be used for the same purpose of liquid detection.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An information processing apparatus comprising:
    a operation keys;
    a key matrix unit including switches comprising first switches which are not associated with the operation keys and second switches which are associated with the operation keys;
    a first detection unit configured to execute a scan process for the key matrix unit, thereby detecting ON state or OFF state of the switches; and
    a suspend process unit configured to execute a suspend process in a case where a number of the first switches in the ON state is one or more but fewer than a predetermined number.

2. The information processing apparatus according to claim 1, wherein the key matrix unit includes a lower sheet which has apertures and is provided with column lines on an upper surface thereof, and an upper sheet which is opposed to the lower sheet and is provided with row lines on a back surface thereof, the row lines intersecting with the column lines, and the switches are provided at intersections between the column lines and the row lines.

3. The information processing apparatus according to claim 2, wherein the apertures are provided around one of the first switches.

4. An information processing apparatus comprising:
    operation keys;
    a key matrix unit including switches comprising first switches which are not associated with the operation keys, and second switches which are associated with the operation keys;
    a first detection unit configured to execute a scan process for the key matrix unit, thereby detecting ON state or OFF state of the switches; and
    a shutdown process unit configured to execute a shutdown process in a case where a number of the first switches in an ON state is one or more but fewer than a predetermined number.

5. The information processing apparatus according to claim 4, wherein the key matrix unit includes a lower sheet which has apertures and is provided with column lines on an upper surface thereof, and an upper sheet which is opposed to the lower sheet and is provided with row lines on a back surface thereof, the row lines intersecting with the column lines, and the switches are provided at intersections between the column lines and the row lines.

6. The information processing apparatus according to claim 5, wherein the apertures are provided around one of the first switches.

7. A liquid detection method for an information processing apparatus comprising operation keys, and a key matrix unit including switches comprising first switches which are not associated with the operation keys and second switches which are associated with the operation keys, the method comprising:

executing a scan process for the key matrix unit, thereby detecting ON state or OFF state of the switches; and executing a suspend process in a case where a number of the first switches in the ON state is one or more but fewer than a predetermined number.

8. A liquid detection method for an information processing apparatus comprising operation keys, and a key matrix unit including switches comprising first switches which are not associated with the operation keys, and second switches which are associated with the operation keys, the method comprising:

executing a scan process for the key matrix unit, thereby detecting ON state or OFF state of the switches; and executing a shutdown process in a case where a number of the switches which is in the ON state is 1 or more but fewer than a predetermined number.

* * * * *